(12) United States Patent
Gill et al.

(10) Patent No.: US 7,166,904 B2
(45) Date of Patent: Jan. 23, 2007

(54) STRUCTURE AND METHOD FOR LOCAL RESISTOR ELEMENT IN INTEGRATED CIRCUIT TECHNOLOGY

(75) Inventors: Jason P. Gill, Essex Junction, VT (US); Terence B. Hook, Jericho, VT (US); Randy W. Mann, Poughquag, NY (US); William J. Murphy, North Ferrisburgh, VT (US); William R. Tonti, Essex Junction, VT (US); Steven H. Voldman, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/708,023

(22) Filed: Feb. 3, 2004

(65) Prior Publication Data

US 2005/0167786 A1 Aug. 4, 2005

(51) Int. Cl.
*H01L 29/00* (2006.01)
(52) U.S. Cl. .................. 257/537; 257/213; 257/288; 257/368; 257/499; 257/528; 257/536; 257/E27.009; 257/903; 257/904; 438/142; 438/197; 438/199; 438/200; 438/210
(58) Field of Classification Search ............ 257/288, 257/368, 369, 379, 380, 385, 571, 572, 573, 257/577, 580, 581, 582; 438/200, 210
See application file for complete search history.

(56) References Cited

U.S. PATENT DOCUMENTS 5,232,865 A * 8/1993 Manning et al.

| 5,330,930 | A | 7/1994 | Chi |
|---|---|---|---|
| 5,665,629 | A | 9/1997 | Chen et al. |
| 5,930,638 | A | 7/1999 | Reedy et al. |
| 6,117,792 | A | 9/2000 | Kitagawa |
| 6,130,462 | A * | 10/2000 | Yang et al. |
| 6,297,083 | B1 * | 10/2001 | Klein |
| 2002/0003311 | A1 | 1/2002 | Uematsu |
| 2003/0116820 | A1 | 6/2003 | Daubenspeck et al. |

FOREIGN PATENT DOCUMENTS

JP 4151825 A 5/1992

OTHER PUBLICATIONS

"Vertically Integrated Load Resistor for MOS Static RAM Cells", IBM Technical Disclosure Bulletin, vol. 26, No. 10B, Mar. 1984, pp. 5675-5677.

* cited by examiner

*Primary Examiner*—Nathan J. Flynn
*Assistant Examiner*—Kevin Quinto
(74) *Attorney, Agent, or Firm*—Patrick J. Daugherty; Driggs, Hogg & Fry Co., LPA

(57) ABSTRACT

A method and system for forming a semiconductor device having superior ESD protection characteristics. A resistive material layer is disposed within a contact hole on at least one of the contact stud upper and lower surface. In preferred embodiments, the integral resistor has a resistance value of between about one Ohm and about ten Ohms, or between 10 and 100 Ohms. Embodiments of the resistive layer include sputtered silicon material, a tunnel oxide, a tunnel nitride, a silicon-implanted oxide, a silicon-implanted nitride, or an amorphous polysilicon. Embodiments of the invention include SRAMs, bipolar transistors, SOI lateral diodes, MOSFETs and SiGe Transistors.

44 Claims, 12 Drawing Sheets

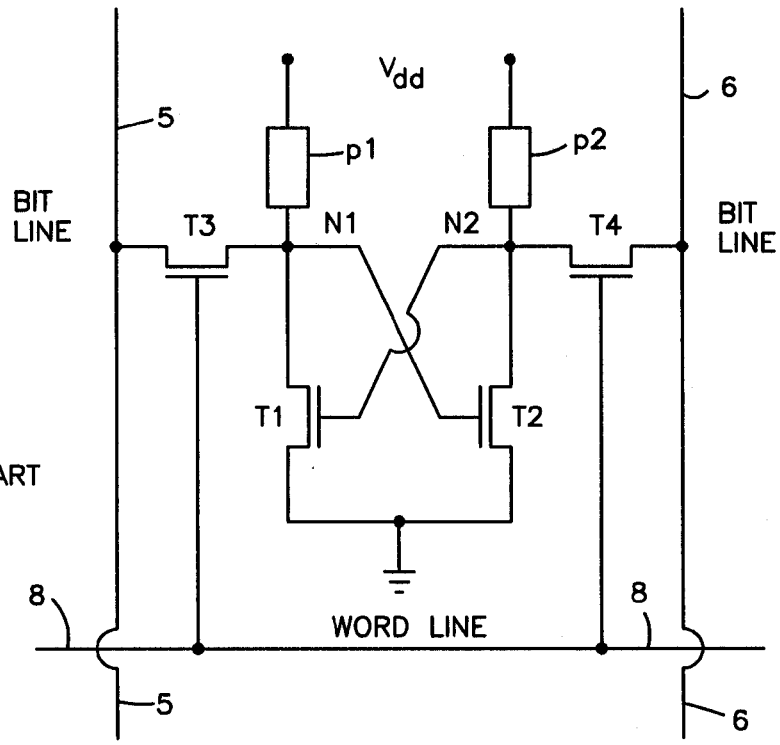
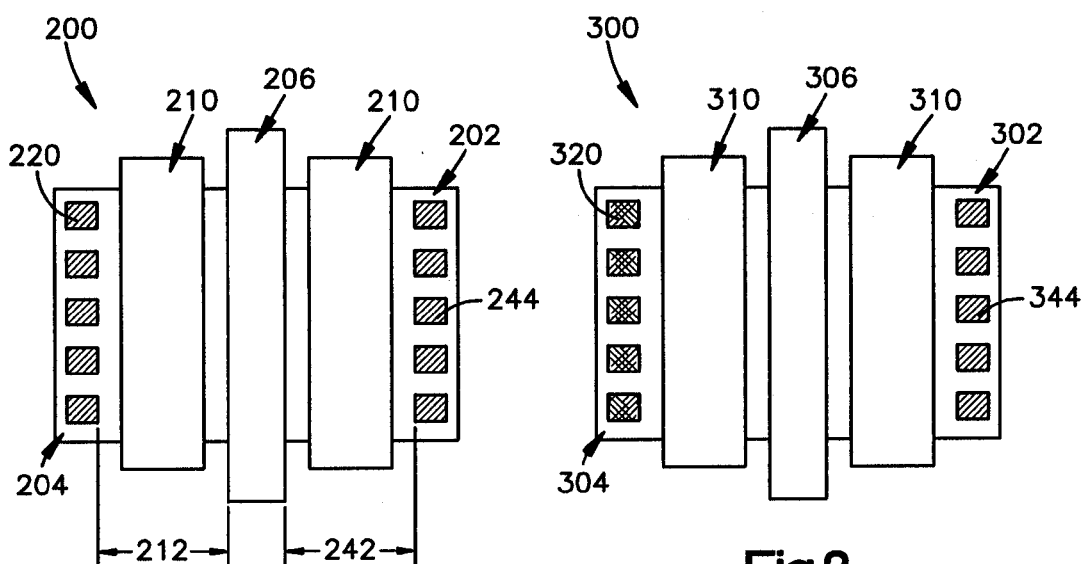

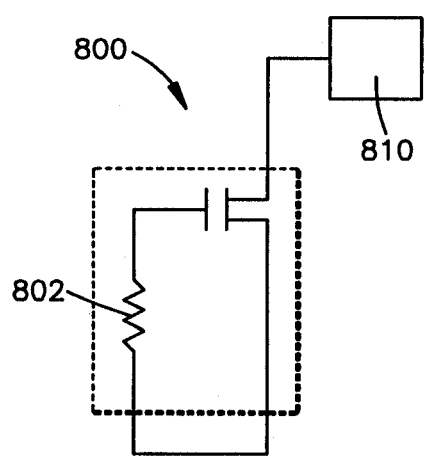
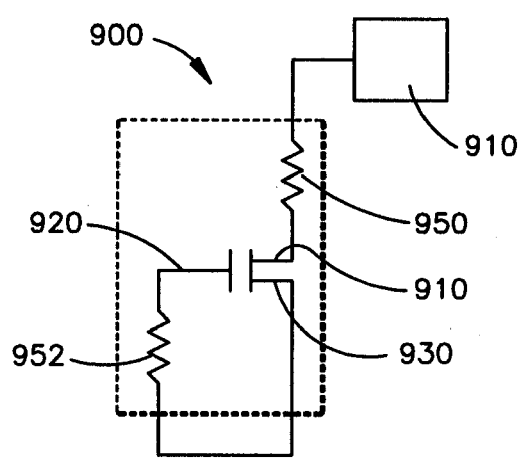
Fig.8  Fig.9
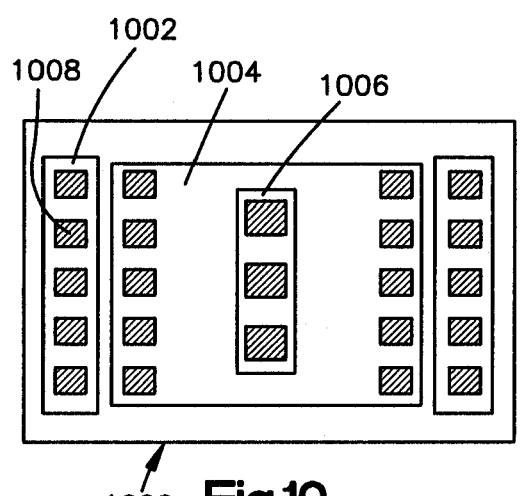
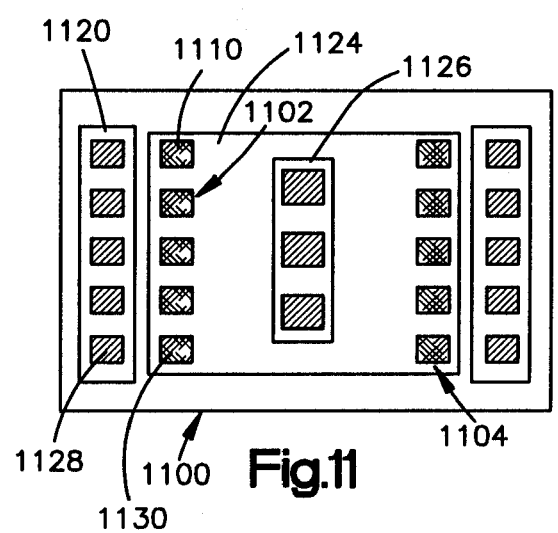
Fig.10  Fig.11

STRUCTURE AND METHOD FOR LOCAL RESISTOR ELEMENT IN INTEGRATED CIRCUIT TECHNOLOGY

BACKGROUND OF INVENTION

1. Field of the Invention

This invention relates generally to localized resistor elements in semiconductor components and, in particular, to protection from failures and errors caused by unwanted electrical events.

2. Background of the Invention

The utilization of resistors is important in semiconductor circuitry design to isolate single components, circuits, sub-circuits, and functional design blocks. In single components, resistors are used to provide improvements in the reliability aspects of semiconductor circuits. Resistor element incorporation is an important reliability mechanism to provide electrostatic discharge protection (ESD) and to prevent CMOS "latchup", electrical overstress (EOS), hot electron and other soft error rate (SER) events. Resistors are also used to prevent parasitic interaction between circuits. As electronic components are getting smaller and smaller along with the internal structures in integrated circuits, it is getting easier to either completely destroy or otherwise impair electronic components through electrical events. In particular, many integrated circuits are highly susceptible to damage from the discharge of static electricity, even at levels which can neither be seen nor felt. Electrostatic discharge (ESD) is the transfer of an electrostatic charge between bodies at different electrostatic potentials (voltages), caused by direct contact or induced by an electrostatic field. The discharge of static electricity, or ESD, has become a critical problem for the electronics industry. Device failures are not always immediately catastrophic. Often, the device is only slightly weakened but is less able to withstand normal operating stresses and, hence, may result in a reliability problem. Therefore, various ESD protection circuits must be included in the device to protect the various components. Many considerations are necessary for ESD protection circuits.

Latchup is known to occur from single event upsets (SEU), also referred to as soft error (SER) events. Single event upsets can include terrestrial emissions from nuclear processes and cosmic ray events, as well as events in space environments. Cosmic ray particles can include proton, and neutron, gamma events, as well as a number of particles that enter the earth atmosphere. Terrestrial emissions from radioactive events, such as alpha particles, and other radioactive decay emissions can also lead to latchup in semiconductors.

Latchup occurs when a pnpn structure transitions from a low-current/high-voltage state to a high-current/low-voltage state through a negative resistance region (i.e. forming an S-Type I-V (current/voltage) characteristic). Latchup is typically understood as occurring within a pnpn structure, or silicon controlled rectifier (SCR) structure. Interestingly enough, these pnpn structures can be intentionally designed, or even unintentionally formed between structures. Hence, latchup conditions can occur within peripheral circuits or internal circuits, within one circuit (intra-circuit) or between multiple circuits (inter-circuit).

Latchup is typically initiated by an equivalent circuit of a cross-coupled pnp and npn transistor. With the base and collector regions being cross-coupled, current flows from one device leading to the initiation of the second ("regenerative feedback"). These pnp and npn elements can be any diffusions or implanted regions of other circuit elements (e.g., P-channel MOSFETs, N-Channel MOSFETs, resistors, etc.) or actual pnp and npn bipolar transistors. In CMOS, the pnpn structure can be formed with a p-diffusion in an n-well, and an n-diffusion in a p-substrate (parasitic pnpn); in this case, the well and substrate regions are inherently involved in the latchup current exchange between regions.

Latchup can be initiated from internal or external stimulus. The condition for triggering a latchup is a function of the current gain of the pnp and npn transistors, and the resistance between the emitter and the base regions. This inherently involves the well and substrate regions. The likelihood or sensitivity of a particular pnpn structure to latchup is a function of spacings (e.g. base width of the npn and base width of the pnp), current gain of the transistors, substrate resistance and spacings, the well resistance and spacings, and isolation regions.

Static random access memory cells or circuits are widely known in the semiconductor technology. A schematic of a typical SRAM cell is shown in FIG. 1. The cell is made of a cross coupled inverter, each inverter having a pulldown transistor T1 or T2, a load p1 or p2, and a pair of transfer transistors T3, T4. The gate electrode of T1 is connected to the drain of T2, and the gate electrode of T2 is connected to the drain of T1 to provide the flip-flop operation. The load device p1, p2 may be a depletion or enhancement transistor or a high value resistor. The load devices p1 and p2 are connected to the power supply $V_{dd}$ on one side and to the drain of drive transistors T1, T2, respectively. The purpose of the resistor load p1, p2 and the power supply $V_{dd}$ is to counteract the effect of charge leakage at the drains of the drive and transfer transistors (nodes N1 and N2). The gates of the transfer transistors T3, T4 are connected to a WORD line 8 and are switched ON by asserting the WORD line 8. The drain/source contacts of the transfer transistors are connected between the nodes N1, N2 and BIT lines 5, 6, respectively.

SRAM operation is well known. In brief, the charge (voltage) in nodes N1 and N2 represents the logic state of the cell. For example, to write a data of "1" in node N1, the bit line 5 is pre-charged to a desired voltage and the word line 8 is asserted. Node N1 is charged up and drives N2 to a "no charge" or a low state. To read the cell, bit lines 5 and 6 are pre-charged and word line 8 is asserted. The bit line 6 is discharged through transistors T4 and T2 and the transient is sensed by a sense amplifier external to the cell.

A four transistor (4T) SRAM uses a high value resistor as its load device. The attraction of 4T SRAM is the potential for reduced cell size compared to a 6T SRAM (which uses transistors instead for load devices). The primary function of the load resistor is to supply enough current to compensate for the junction leakage and maintain the charge in the node. Junction leakage current typically ranges from femtoampere to picoampere ($10^{-15}$ to $10^{-12}$ amps) for Field Effect Transistors (FET's) fabricated under contamination free conditions, which is the minimum current required from the loaded (p1, p2) power supply $V_{dd}$. A typical maximum resistor value acceptable is in the range of $10^2$ to $10^{15}$ ohms, assuming a $V_{dd}$ of 3 to 5 volts. The value of the resistor, in turn, is affected by availability of material that has very high intrinsic resistance and the cell area available for resistor layout. In addition, the resistor material and process should be compatible with silicon manufacturing.

Intrinsic polysilicon, a suitable material for high value resistors, can be used in a selected thickness range to provide sheet resistance as high as a few hundred gigaOhms, but it takes up a large part of the cell area. Since read operation causes temporary partial change in the charge stored in the nodes N1 and N2, a higher current from the loaded power supply can restore the charge in the nodes quickly to its "write value". This restoration may determine how fast data can be repeatedly read.

Softsusceptibility is increased when the charge in the node is off its maximum. Fast charging from the power supply can reduce soft error occurrence as the nodes will be charged to full voltage and, therefore, are less susceptible than if the charge levels were lower. Thus, considerations suggest use of a lower value leakage resistor.

However, the primary attraction of a 4T-SRAM continues to be its small size and lower manufacturing cost for stand alone memory. It has been the goal of many researchers to develop resistors of higher value so that a high value resistor can be easily integrated into the SRAM process using minimum chip area SRAMs which are susceptible to soft errors. A soft error occurs in an SRAM when ionizing radiation strikes the Si substrate and creates free electrons and holes. The free electrons and holes migrate under electric fields to different parts of devices, and can change the state of a memory cell or interfere with reading data from cells. Load resistor SRAMs may be more susceptible than 6Tif the current supply to restore soft error ionization is too small, i.e. on the order of picoampere per cell. However, use of high load current can lead to excessive power consumption. There is, therefore, a need to have an improved high resistance SRAM that requires a steady low current, is compatible with low power supplies, takes up very little space, has improved soft error tolerance and has low process complexity.

In a semiconductor chip environment in general, ESD protection is also important for shipment of semiconductor components. ESD protection may be provided by placement of ballasting resistors in series with MOSFETs in CMOS technology. Additionally, ESD protection is provided by placement of resistor elements in the emitter, base or collector in a bipolar transistor element. ESD is a concern in peripheral circuits, such as transmitter and receiver networks, system clocks, phase lock loops, capacitors, decoupling capacitors and fill shapes.

ESD events can occur from human body model (HBM) events, machine model (MM) events, charged device model (CDM) events, and cable discharge events. These different events have different pulse widths and magnitudes, leading to different failure mechanisms. ESD failures can be prevented by placement of resistor elements in MOSFETs, bipolar transistors, or diode structures. Placement of the resistor elements in a MOSFET can be placed in the source, drain or gate region, and each will be influenced by different failure events. For example, gate structures of a MOSFET are sensitive to CDM events. Resistors in series with the drain structure assists HBM and MM events. In a bipolar transistor, placement of a resistor in series with the base is key to provide ESD protection of the Si bipolar junction transistor (BJT) device from HBM and MM events. Placement of resistors in the emitter also improves electrical and thermal stability. These elements must be placed not to impact the radio frequency (RF) characteristics of the semiconductor chip.

For example, ESD protection circuits for input nodes must also support quality DC, AC, and RF model capability in order to co-design ESD circuits for analog and RF circuits. With the growth of the high-speed data rate transmission, optical interconnect, wireless and wired marketplaces, the breadth of applications and requirements is broad. Each type of application space has a wide range of power supply conditions, number of independent power domains, and circuit performance objectives.

Much effort has been expended by industry to address the problems described above. A difficulty in the design of prior art SER and RF ESD solutions to protect electronic devices from damage is that resistor elements introduce capacitive and inductive effects. They also require valuable space, resulting in reduced circuit design efficiencies. Hence, it is desirable to incorporate high quality resistive elements in semiconductor architectures that do not impact the RF performance of circuits yet provide ESD protection. It is desired to incorporate high quality resistive elements within transistor and similar gate structures that prevent single event induced latchup without reducing spacing efficiencies or adversely impacting circuit impedance, capacitance and parasitic resistance behavior.

SUMMARY OF INVENTION

The present invention provides a system and method for efficient resistor design for semiconductor circuit ESD, CMOS "latchup", electrical overstress (EOS), hot electron and soft error rate (SER) event protection. More particularly, the present invention teaches an improved localized resistor placed in series with gate structures to prevent single event induced latchup and data loss. The invention also provides a system and method for efficient resistor design for ESD protection, wherein a resistor value or combination of resistor values is selected responsive to the transistor structure and ESD protection desired.

In one embodiment, ESD ballasting resistors are provided, wherein low value resistors are typically provided in series with MOSFET source or drain structures for HBM events. In another embodiment, high value resistors are used in series with a MOSFET gate. In another embodiment, ballasting in a Bipolar transistor is achieved with a low resistance element in series with the base, emitter or collector of an Si BJT or SiGe Heterojunction Bipolar Transistor (HBT) device.

The present invention provides an efficient low resistance high Q resistor element for ESD protection. The invention provides an efficient low value resistor for latchup reliability in a CMOS and BiCMOS technology, an efficient low value resistor for ESD reliability in a CMOS and BiCMOS technology; and an efficient high value resistor circuit for ESD reliability in a CMOS and BiCMOS technology.

BRIEF DESCRIPTION OF DRAWINGS

FIG. 1 is a prior art SRAM circuit.

FIG. 2 is a graphical image of a prior art MOSFET transistor structure.

FIG. 3 is a graphical image of an Asymmetric MOSFET transistor structure with local resistor ballasting according to the present invention.

FIG. 8 is a schematic diagram illustrating a grounded gate salicide blocked MOSFET structure and local resistor according to the present invention.

FIG. 9 is a schematic diagram illustrating a drain ballasted salicide blocked MOSFET structure according to the present invention.

FIG. 10 is a graphical layout illustrating a Silicon Germanium (SiGe) HBT device according to the present invention.

FIG. 11 is a graphical layout illustrating an SiGe HBT device with local base resistor elements according to the present invention.

DETAILED DESCRIPTION

Figure 4:
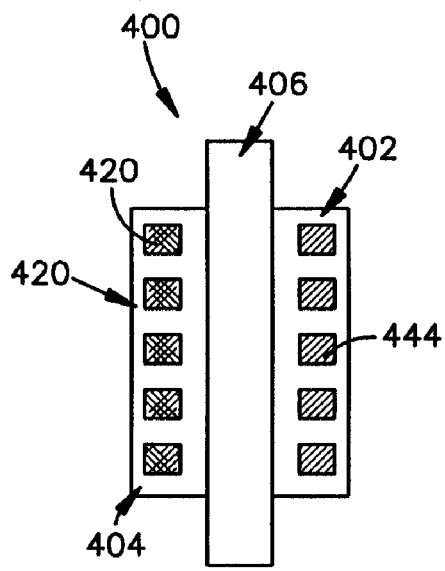
FIG. 4 is a graphical image of an Asymmetric MOSFET transistor structure with local resistor ballasting interdigited into the contact structures according to the present invention.

Referring now to FIG. 2, a graphical image of a standard prior art MOSFET transistor structure 200 is provided. MOSFETs are vulnerable to ESD events. ESD damage is evident in the source and drain diffusions and gate structure. Non-uniform current constriction also leads to early failure. In order to provide ESD and latchup protection, the MOSFET 200 contains source 202, drain 204 and gate structure 206 separated by large Salicide block mask "OP" resistor structures 210. However, in order to fit the block mask resistor structures 210 into the prior art MOSFET 200, the widths of the diffusions underneath must be expanded. Therefore, the spacing 212 between the gate 206 and the drain 204 contacts 220, and the spacing 242 between the gate 206 and the source 202 contacts 244 must be accordingly enlarged to accommodate the block mask resistor 210 structures, thus resulting in additional capacitance and large inefficiencies of area, spacing, materials and overall device size.

FIG. 3 is a graphical image of an Asymmetric MOSFET transistor structure 300 with local resistor ballasting according to the present invention. It is Asymmetric in that the drain 304 resistance is not equal to the source 302 resistance. An advantage of the present invention is that adding a local resistor element Asymmetrically introduces resistor ballasting effects in the drain structure 304 without requiring corresponding resistor structures on the source side 302 or either OP block 310. Through resistor ballasting, the RF ESD benefits of a high-resistance structure under prior art techniques can be accomplished with a medium or low resistance structure. A one to 100 Ohm local resistor structure can thus accomplish the ESD benefits equivalent to a mega-Ohm large resistor incorporated into the structure through prior art techniques. Using a small resistor on the order of the contact hole size reduces capacitive and inductive effects. Other solutions such as diffused resistors or even wire interconnects are area intensive and lead to poor Q values due to inductive and capacitive effects. Using the local resistor 320, good ESD ballasting is achieved without RF degradation effects.

FIG. 4 is a graphical image of another Asymmetric MOSFET transistor structure 400 according to the present invention with local resistor 422 ballasting interdigited into the contact structures 420. Adding a local resistor element 422 introduces ballasting in the drain structure 404. Here the local resistor ballasting provides satisfactory ESD and latchup protection, obviating the need for salicide block mask structures. Using a small resistor 422 on the order of the contact hole size reduces capacitive and inductive effects. Other solutions such as diffused resistors or even wire interconnects are area intensive and lead to poor Q values due to inductive and capacitive effects. Using the local resistor 422, an advantage is that good ESD ballasting is achieved without RF degradation effects. Additionally, by choosing the location of the contact 444 relative to the resistor 422, non-uniform thermal distribution can be compensated and improved lateral current distribution is achieved.

Figure 5:
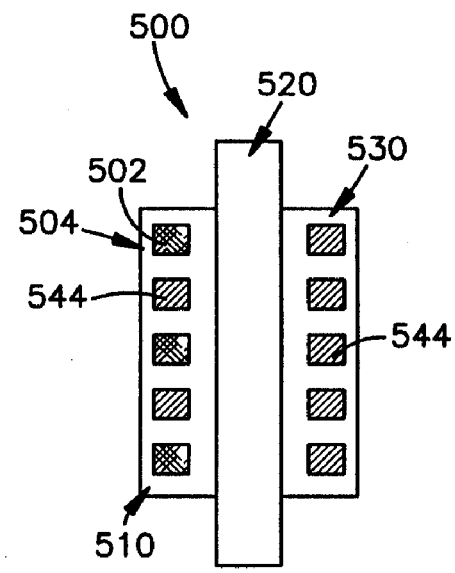
FIG. 5 is a graphical image of a Silicon-On-Insulator (SOI) Asymmetric MOSFET transistor structure with local resistor ballasting interdigitated into the contact structures and gate resistor structure according to the present invention.

FIG. 5 is a graphical image of a Silicon-on-insulator (SOI) Asymmetric MOSFET transistor structure 500 according to the present invention with local resistor ballasting interdigited into the contact structures 502 and 504 and gate resistor structure 520. Adding a local resistor element 504 introduces ballasting in the drain structure 510. Using a small resistor 504 on the order of the contact hole size reduces capacitive and inductive effects. Other solutions such as diffused resistors or even wire interconnects are area intensive and lead to poor Q values due to inductive and capacitive effects. Using the local resistor 504, good ESD ballasting is achieved without RF degradation effects. In SOI technology, failure mechanisms unique to SOI occur between the gate 520 and the drain 510, and the gate 520 and the source 530. Hence, in SOI having a high resistance element in series with the gate can eliminate Charge Device Model failure mechanisms observed in advanced SOI microprocessors.

An important advantage of the present invention illustrated in FIG. 5 is that the local resistor may be selectively introduced into a specified number of contact regions responsive to the current flow modification desired. As illustrated, three local resistors 504 are introduced into three specified contact regions 502 in the drain region 510, into an alternating arrangement with drain contacts 504. Thus, the present invention enables the introduction of non-uniform resistance on one side only of the source-drain structure. This enables spreading out current flow, or optimizing current flow, on the drain side by the selective placement of the local resistors 504. This is very important in high current flow applications, because current flow through a transistor source-drain structure is not uniform. The present invention enables modulation of that current flow through the selective placement of the local resistors 504.

The ballasting local resistors discussed thus far are formed within contact holes within transistor drain structures. Where the structural dimensions available to the local resistors are limited to the size of contact holes under the present invention, their resistance values are also necessarily limited by this physical constraint. Generally, the drain contact hole local resistors resistance values cannot provide mega-Ohm values, which some applications may demand.

Figure 6:
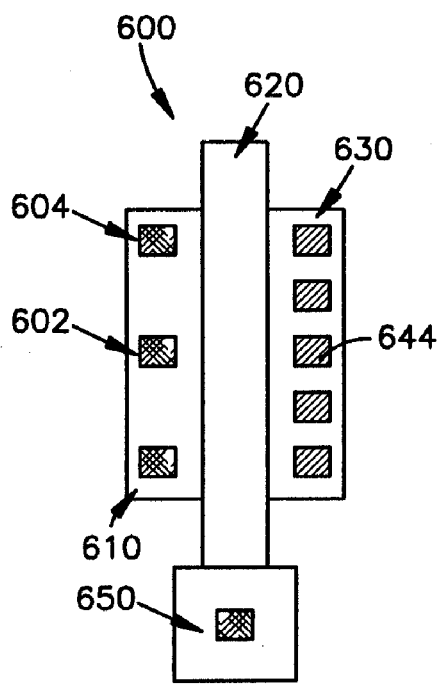
FIG. 6 is a graphical image of an SOI Asymmetric grounded gate MOSFET transistor structure with local resistor ballasting interdigited into the contact structures and gate resistor structure the guard ring structure for ESD according to the present invention.

FIG. 6 is a graphical image of an Asymmetric MOSFET transistor structure 600 according to the present invention with local resistor ballasting in the drain and gate structures. As discussed above, adding a contact local resistor element 604 introduces ballasting in the drain structure 610. Using a small resistor on the order of the contact hole size 602 reduces capacitive and inductive effects. Other solutions such as diffused resistors or even wire interconnects are area intensive and lead to poor Q values due to inductive and capacitive effects. Using one or more drain contact local resistors 604 provides good ESD ballasting without RF degradation effects. Another advantage of the present invention is the addition of a local resistor 650 to the gate 620. This local resistor 650 cuts back the current flow through the gate structure 620, which improves the current leakage characteristics of the gate 620. Placing the local resistance 650 in series with the gate 620 also improves the impedance of the gate structure 620 and thereby improves ESD protection for the MOSFET 600.

Figure 7:
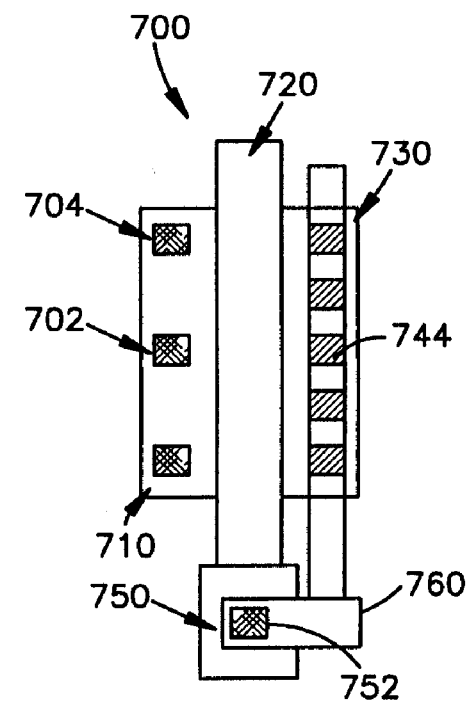
FIG. 7 is a schematic image of an Asymmetric grounded gate MOSFET transistor structure with local resistor ballasting into the gate structure according to the present invention.

FIG. 7 is a schematic image of an Asymmetric grounded gate MOSFET transistor structure 700 with local resistor 750 ballasting in the gate structure 720. In this structure, the gate 720 is OFF and "tied" to ground 760. It is important that the gate 720 is not hardwired directly to ground, but is instead "coupled" to ground 760 through the local resistor 750 placement in the gate contact hole 752. When the gate 720 is grounded in this fashion, the impedance is still significant between the gate 720 and the true source 730 contact point. The gate 720 structure can now respond from an ESD pulse associated with the RC response of the high resistance and native capacitance of the drain 710. Hence, the gate structure 720 will couple to an input source contact pad 744 when an ESD event occurs. This advantage is key to ESD protection of this circuit. Using the gate local resistor 750 good ESD ballasting is achieved without RF degradation effects.

It is preferable that a high resistance resistor 750 is provided in the gate structure 720. Using a low resistance contact resistor in the drain, and a high resistance in the gate structure, current will flow from source to drain without limitations. Additionally, the gate structure can now respond from the ESD pulse associated with the RC response of the high resistance and native capacitance of the drain. Hence, the gate structure will couple to the input pad when an ESD event occurs. This advantage is key to ESD protection of this circuit. Also, in a CDM event a charge comes into a prior art MOSFET device substrate through a source 630 and passes through the gate and then back into the drain avoiding the source: in the present embodiment the impedance provided by the local resistor 750 in series with the gate 720 will avoid that current path. These advantages are also provided with an economy of size due to the placement of the resistor 752 within the contact hole 752.

FIG. 8 is a schematic diagram illustrating a grounded gate salicide blocked MOSFET structure 800 coupled to a ground 810. Adding salicide block masks to achieve ESD ballasting requires area and adds extra loading effect due to the source and drain capacitance. This technique integrates the local gate resistor 802 into the MOSFET, but is limited by the source/drain resistance values of the implants.

FIG. 9 is a schematic diagram illustrating a salicide blocked MOSFET structure and local resistor ballast elements coupled to a ground 910 according to the present invention. To provide drain effects, a drain resistor 952 is used in series with the drain 910, source 930 and gate 920 with local gate resistor 950 structure. Because higher resistor values can have an adverse impact and slow down device performance, a medium resistance value local resistor 950 of from about 10 to about 100 Ohms is typically preferred for this application. For example, a 10 Ohm driver trying to drive the local resistor 950 in series with a receiver is looking for certain impedances, and a medium range resistor will provide superior performance over a high range resistor typically found in prior art ESD structures. Adding salicide block masks to achieve ESD ballasting requires area and adds extra loading effect due to the source and drain capacitance. This standard technique integrates the resistor into the MOSFET but is limited to the source/drain resistance values of the implants. Adding the local resistor does not impact the Q of the RF element nor area. By providing both solutions, the resistance of the drain and source is not dependent on the MOSFET source drain series sheet resistance.

FIG. 10 is a graphical layout illustrating a typical prior art Silicon Germanium Transistor (SiGe) 1000. Contacts 1008 are formed within emitter 1006, base 1004 and collector 1002 regions. For ESD protection issues, the SiGe transistor is vulnerable to emitter 1006, base 1004 and collector 1002 failure mechanisms. Common weaknesses of this element are base 1004-emitter 1006 failure mechanisms. Failures also occur at the collector 1002 to emitter 1006 interface.

FIG. 11 is a graphical layout illustrating an SiGe transistor 1100 with local resistor elements 1102 incorporated into selected contact regions 1110 within the base 1124 according to the present invention. The local resistor elements 1102 provide ESD protection from base 1124-emitter 1126 failure mechanisms. SiGe HBT devices require high frequency operation and are impacted by inductive and capacitive resistor elements. Hence, having a resistor 1102 local to the device which does not add capacitance or inductance has an advantage. The resistor 1102 changes the effective base resistance of the base 1104, and thereby provides ESD protection. Additionally, by selectively choosing and locating resistors in some base contact holes 1110 and not locating resistors in other base contact holes 1130, the present invention can also be used to modulate lateral resistor ballasting issues in the base lateral to the current flow.

Figure 12:
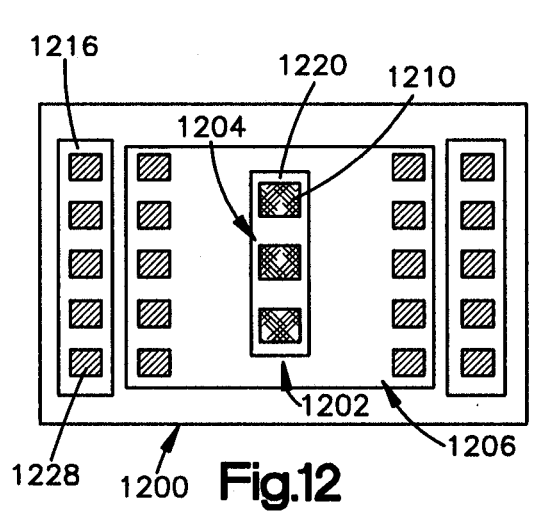
FIG. 12 is a graphical layout illustrating an SiGe HBT device with local emitter resistor elements according to the present invention.

FIG. 12 is a graphical layout illustrating an SiGe transistor 1200 with local emitter 1202 resistor elements 1204 incorporated into emitter contacts 1210 according to the present invention. Contact regions 1228 are formed within emitter 1202, base 1206 and collector 1216 regions. SiGe HBT devices require high frequency operation and are impacted by inductive and capacitive resistor elements. Hence, having a resistor 1204 local to the device which does not add capacitance or inductance has an advantage. The emitter resistor 1204 can provide ESD protection as well as can be used to modulate lateral resistor ballasting issues in the base 1206 lateral to the current flow. Emitter ballasting provides both electrical and thermal stability.

Because of loading effects and frequency response, a low resistance value is preferred in the emitter resistor 1204 to minimize performance impact. Thus, a "high Q"element is preferred. There should be no parasitic resistance, conductance or capacitance affiliated with the use of the local resistor 1204. Building a resistor out of silicon materials typically results in silicon capacitance, inductance or space issues. Therefore, a significant advantage of the present invention for SiGe structures is the ability to provide a small, compact resistor element within the contact holes that does not have the inherent disadvantages of resistor elements fabricated from the Si structural elements, such as the large salicide block mask "OP" resistor structures 210 of FIG. 2. Emitter local resistor 1204 resistance values on the order of about one to about ten Ohms will provide good emitter ballasting. The limited resistance values also provide thermal and electrical stability advantages over prior art device resistor structures.

Figure 13:
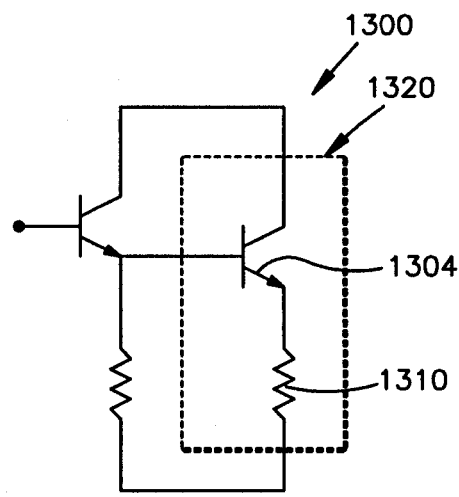
FIG. 13 is a schematic diagram illustrating an SiGe HBT device with local emitter resistor elements according to the present invention.

FIG. 13 is a schematic diagram illustrating an SiGe transistor local emitter resistor circuit 1300. The SiGe transistor 1304 and local emitter resistor element 1310 are integrated into output stage solution 1320, which results in improved performance and a savings of about 30% area over a prior art structure that uses an external resistor (not shown). SiGe HBT devices require high frequency operation and are impacted by inductive and capacitive resistor elements. Hence, having a resistor 1310 local to the device which does not add capacitance or inductance has an advantage. The emitter resistor 1310 can provide ESD protection as well as can be used to modulate lateral resistor ballasting issues in the base lateral to the current flow. Emitter ballasting provides both electrical and thermal stability. A low resistance value is preferred to minimize performance impact. Resistance values on the order of about one to about ten Ohms will provide good emitter ballasting according to the present invention.

Figure 14:
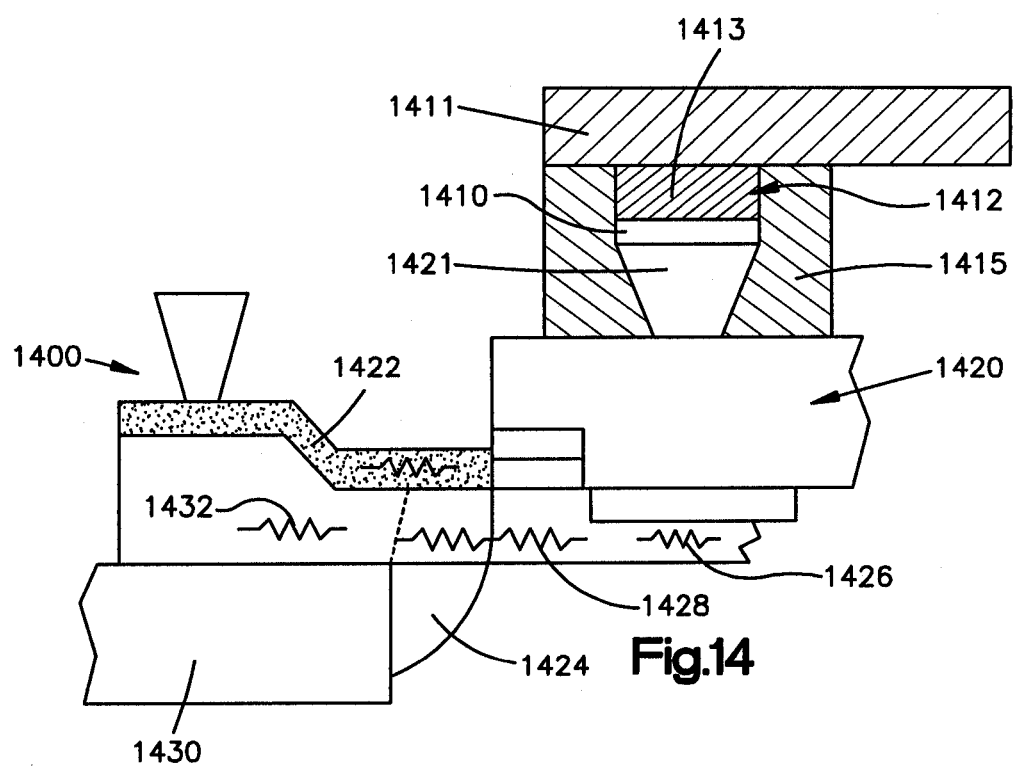
FIG. 14 is a cross section of an SiGe HBT device with the local resistor element integrated into the emitter structure according to the present invention.

FIG. 14 is a cross section of an SiGe transistor 1400 with a local resistor element 1410 integrated into the contact hole 1412 of the emitter structure 1420 according to the present invention. An emitter region 1421 projects into the contact hole 1412; the hole 1412 formed as an opening in a dielectric substrate material 1415. A conductive metal layer 1411 is disposed over the dielectric substrate 1415, with conductive element 1413 forming a structural and circuit connection between the metal layer 1411 and the local resistor 1410. The emitter resistor 1410 can provide ESD protection as well as can be used to modulate lateral resistor ballasting issues in the base 1422 lateral to the current flow. The device incorporates an external resistor element 1432, and internal resistor element 1426 and a resistor link structure 1428. STI region 430 and P+ region 1424 portions are also shown. Emitter ballasting provides both electrical and thermal stability. A low resistance value is required to minimize performance impact. Resistance values on the order of about one to about ten Ohms will provide good emitter ballasting. This structure thus provides improved performance for transistors running at speeds of 45, 90, 200 and 300 Gigahertz.

Figure 15:
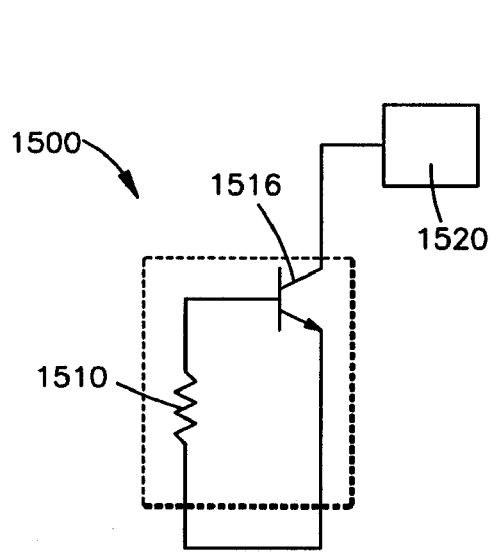
FIG. 15 is a schematic diagram illustrating an SiGe HBT device with the local base resistor element according to the present invention.

FIG. 15 is a schematic diagram illustrating an SiGe transistor 1500 with a local base resistor element 1510 wherein the base 1516 is coupled to ground 1520. A weakness of an SiGe transistor is the base-emitter failure mechanisms. SiGe HBT devices require high frequency operation and are impacted by inductive and capacitive resistor elements. Hence, having a resistor 1510 local to the device which does not add capacitance or inductance has an advantage, as well as providing an area savings of about 20% over external resistor structures (not shown). The base resistor 1510 can provide ESD protection as well as can be used to modulate lateral resistor ballasting issues in the base lateral to the current flow.

Figure 16:
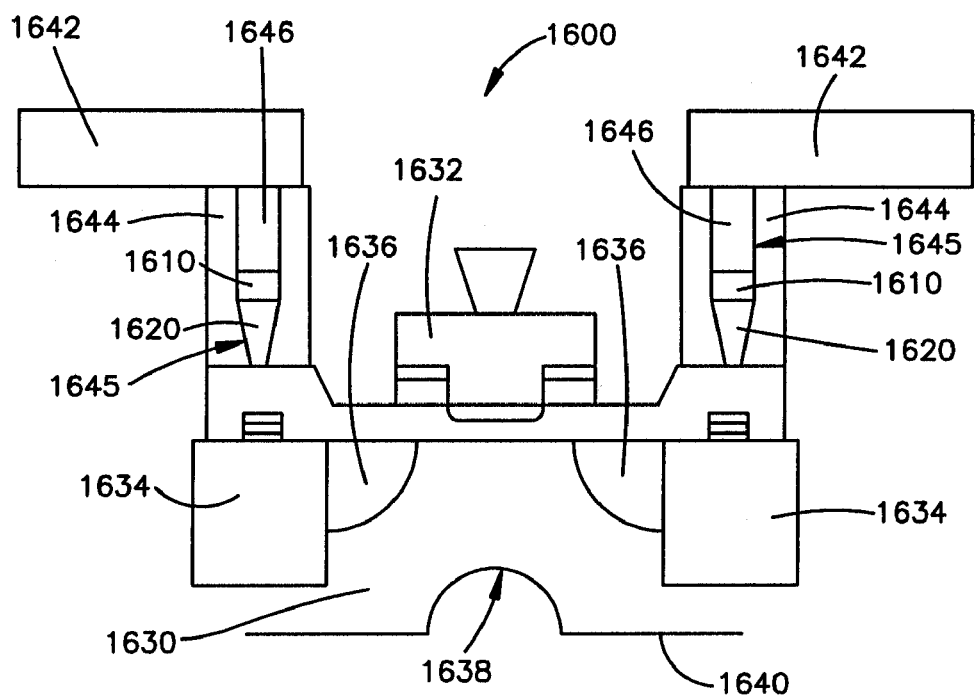
FIG. 16 is a cross section of an SiGe HBT device with the local resistor element integrated into the base structure according to the present invention.

FIG. 16 is a cross section of an SiGe transistor circuit 1600 with a local resistor element 1610 integrated into two parallel base structures 1620 according to the present invention. An N-Collector 1630 is bordered by P+ regions 1636 and STI regions 1634, and above an N+ pedestal 1638 and an N++ subcollector 1640. An N+ emitter 1632 is disposed above the collector 1630. Base projections 1620, conductive elements 1646 and local resistors 1610 are located within contact holes 1645; the holes 1645 formed as openings in a dielectric substrate material 1644. The conductive elements 1646 form structural and circuit connections between metal layers 1642 and the local resistors 1610. A weakness of an SiGe transistor is the base 1620-emitter 1632 failure mechanisms. SiGe HBT devices require high frequency operation and are impacted by inductive and capacitive resistor elements. Hence, having a resistor local to the device which does not add capacitance or inductance has an advantage. The base resistor 1610 can provide ESD protection as well as can be used to modulate lateral resistor ballasting issues in the base 1620 lateral to the current flow. The circuit 1600 may be grounded, or it may be an input circuit without grounding.

Figure 17:
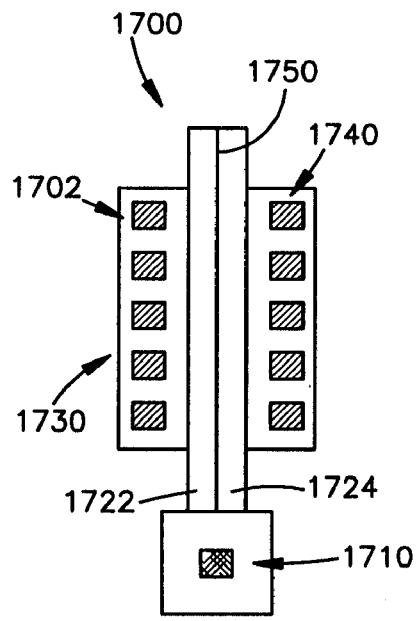
FIG. 17 is a graphical layout of an SOI lateral diode structure with local integrated resistor elements integrated with the gate structure according to the present invention.

FIG. 17 is a graphical layout of a Silicon-on-insulator (SOI) lateral diode circuit 1700 with a local integrated resistor element 1710 integrated into the gate structure 1720 according to the present invention. In SOI technology, lateral elements are used for ESD protection. The SOI lateral diode 1700 differs from a transistor structure. One side is a "PFET-type"structure 1730, and the other is an "NFET-type"structure 1740. A mask 1750 is dropped down the middle, with the gate 1720 "P-doped"on one side 1722 and "N-doped"on the other side 1724. Thus, the lateral diode 1700 does not define an npn or pnp structure like a transistor. Instead, it may be a p+p−n+ or p+p−n−device, dependent upon the doping of the gate 1720. Using a local resistor element 1702 in the anode 1730, cathode 1740 or gate 1720 region allows prevention of failure during ESD events. CDM failures in prior art structures typically occur through the gate structure 1720 from gate-to-source and gate-to-drain. Adding a resistor 1710 to the gate structure 1720 prevents electrical overstress of the gate structure from HBM, MM and CDM events. In receiver networks, SOI failures occurred through pass transistors leading to failure.

Having the local resistor structures 1702 and 1710 in the contact holes prevents ESD failures in SOI microprocessors.

Figure 18:
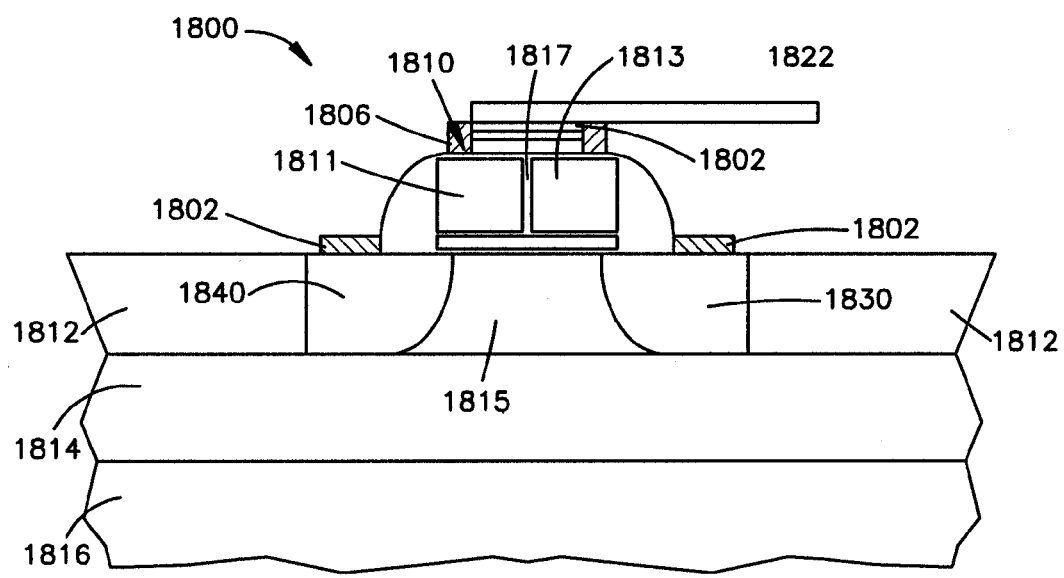
FIG. 18 is a cross section of an SOI lateral diode structure with local integrated resistor elements integrated with the gate structure according to the present invention.

FIG. 18 is a cross section of an SOI lateral diode structure 1800 with local integrated resistor element 1802 integrated within the gate structure 1810 according to the present invention. The device 1800 is a Lubistor with an abrupt junction. An N+ cathode 1840 and P+ anode 1830 are provided about a gate structure 1810. The gate structure 1810 includes a mask 1817, one side of which is an N+-doped region 1811, the other side being a P+ doped region 1813, with these structures disposed above an N-region 1815. STI regions 1812, a buried oxide layer 1814 and a P−/P+ substrate 1816 are also provided. A conductive metal layer 1822 is in circuit connection with the local resistor 1802. Although the present embodiment illustrates local resistor elements 1802 in all of the anode 1830, cathode 1840 and gate 1810 regions, the local resistor may be allocated in only one or more of these regions 1830, 1840 and 1810. Using a local resistor element 1802 in the anode 1830, cathode 1840 or gate region 1810 allows prevention of failure during ESD events. CDM failures occur through the gate structure from gate to source, and gate to drain. Adding a resistor 1802 to the gate structure 1810 prevents electrical overstress of the gate structure 1810 from HBM, MM and CDM events. In receiver networks, SOI failures occurred through pass transistors leading to failure. Having the local resistor structure 1802 in the contact hole prevents ESD failures in SOI microprocessors. This element is key to providing success in SOI technology.

Figure 19:
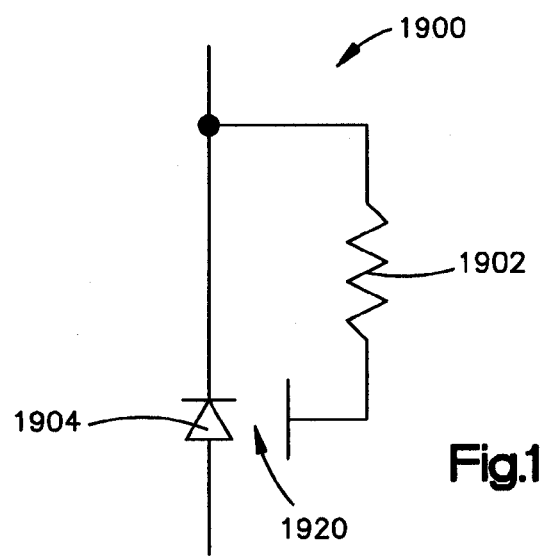
FIG. 19 is a schematic layout of an SOI lateral diode structure with local integrated resistor elements integrated with the gate structure according to the present invention.

FIG. 19 is a schematic layout of an SOI lateral diode circuit 1900 according to the present invention. A polysilicon bound diode 1904 with a gate structure 1920 is parallel to a local integrated resistor element 1902. Using a local resistor element 1902 in the gate region 1920 allows prevention of failure during ESD events. CDM failures occur through the gate structure from gate to source, and gate to drain. Adding a resistor 1902 to the gate structure prevents electrical overstress of the gate structure from HBM, MM and CDM events. In receiver networks, SOI failures occurred through pass transistors leading to failure. Having the local resistor structure in the contact hole prevents ESD failures in SOI microprocessors.

What is important is that the present invention teaches the use of localized resistor elements that keep the Q factor high and resistance up enough to drive current through the circuit and thereby enable use of the circuit through current flow when the circuit is in use, and to provide protection to stop current flow through the circuit from latchup, HBM, MM and CDM events when the circuit is not in use. As illustrated above, the present invention may be applied in SOI and CMOS applications, as well as MOSFET circuitry, by integrating with SiGe transistors.

Figure 20:
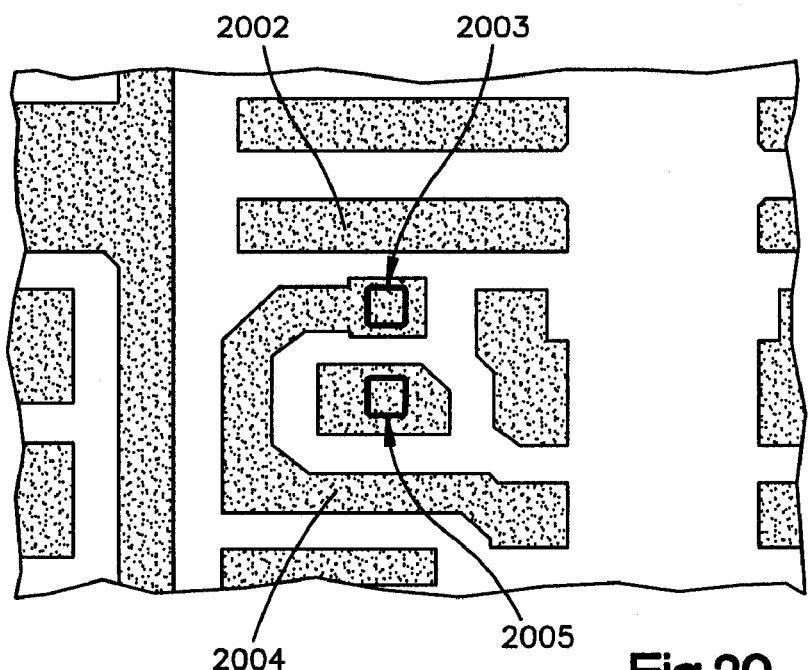
FIG. 20 is a top plan illustration of an SRAM cell showing localized resistor locations according to the present invention.

With respect to the prevention of soft-error latch upsets in SRAM applications, as described above, it is desirable to insert a resistance in the path of a cross coupling structure. It is also preferred to do so without increasing the size of the cell. FIG. 20 illustrates a typical SRAM cell layout showing the location of the nodes 2002 and 2004 and proposed locations of localized resistors 2003 and 2005 according to the present invention.

Figure 21:
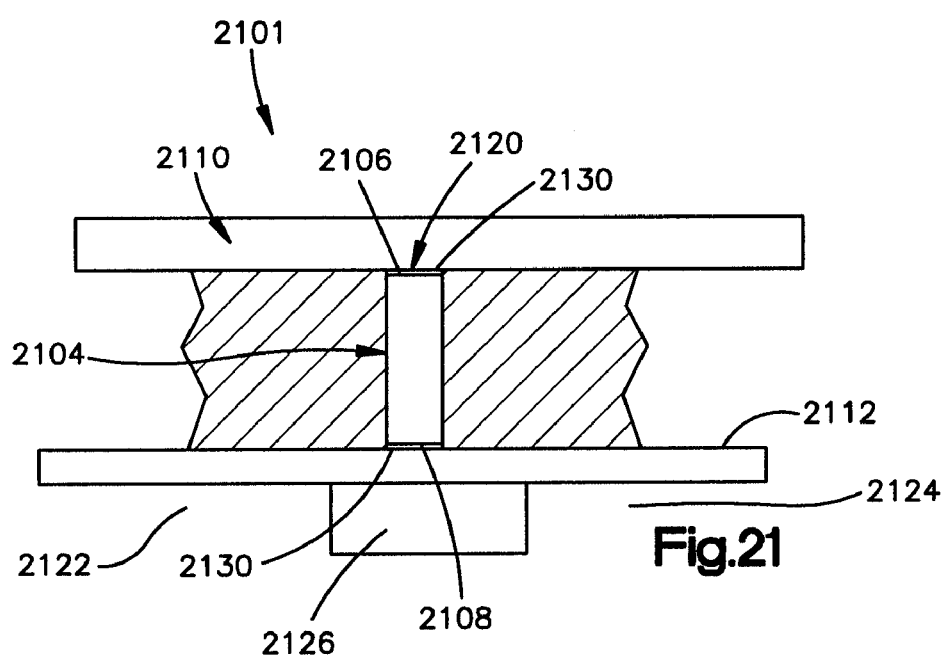
FIG. 21 is a block illustration of a transistor contact according to the present invention.

FIG. 21 is a block illustration of a W CA transistor contact 2104 illustrating preferred location 2106 and 2108 for a localized resistor film according to the present invention. A polysilicon gate node 2112 is disposed above oxide 2126, pfet 2122 and nfet 2124 regions. By adding a resistor film 2130 between an M1 metal layer 2110 and a polysilicon gate node 2112 in a cross coupling node region 2101, at either a contact-to-M1 interface 2106 or a contact-to-polysilicon gate intertice 2108, and limiting the width of the resistance film 2130 to the width of the contact via hole 2120, a localized resistor 2130 may thus be added without increasing the cell size.

The actual size and alignment of the localized resistor film 2130 is critical to the invention because the electrical characteristics of the resultant contact 2104-resistor film 2130 circuit will be determined by the material properties, area and size of the contact 2104. Is preferred that the localized resistor film 2130 is an insulating or semi-insulating material. Suitable materials include a tunnel oxide or nitride, silicon-implanted oxide or nitride. Appropriate values and resistance are determined by SER immunity and by the write speed and functionality of the device 2101. Typically low resistance excursions are not a problem with the present invention. In fact, a few cells may be more susceptible to SER.

In one embodiment of the invention, a transistor structure is formed as follows. All transistor structures are defined and formed in a typical prior art manner, up to and including contact fill and polish. A local resistor film according to the present invention is then deposited upon the contact. A suitable film may be an amorphous polysilicon, 0.1 microns thick, 100 O-cm. A mask is applied and the resistance film is removed from all but relevant contacts. Normal processing then proceeds to a standard M1 etch, with the M1 etch stopping on the film. Normal processing then proceeds again.

In another embodiment of the present invention, a transistor device is defined through typical prior art process steps, up to the step of depositing a barrier nitride film. A resistor film is then deposited; processing then continues as usual up to the "contact etch" step. All contacts are etched through the barrier nitride, with etching stopping on the new resistor film. Mask and etching steps than proceed, with the resistance film being etched away from all but relevant contacts. Normal device processing then proceeds again.

In another embodiment of the present invention, transistor devices are again defined in a typical prior art manner up to an M1 insulator deposition step. M1 troughs are defined for resistive contact formation. A resistor film, such as an amorphous polysilicon, 0.1 microns thick, 100 O-cm, is deposited in the defined troughs. Additional desired M1 troughs are then defined, and typical device processing steps then proceed from this point to complete the manufacture of the device.

Embodiments described above provide high resistance, local resistor-contact structures without changing cell size. The present invention also teaches methods and structures using processes and materials and is compatible with copper integration schemes.

Figure 22A:
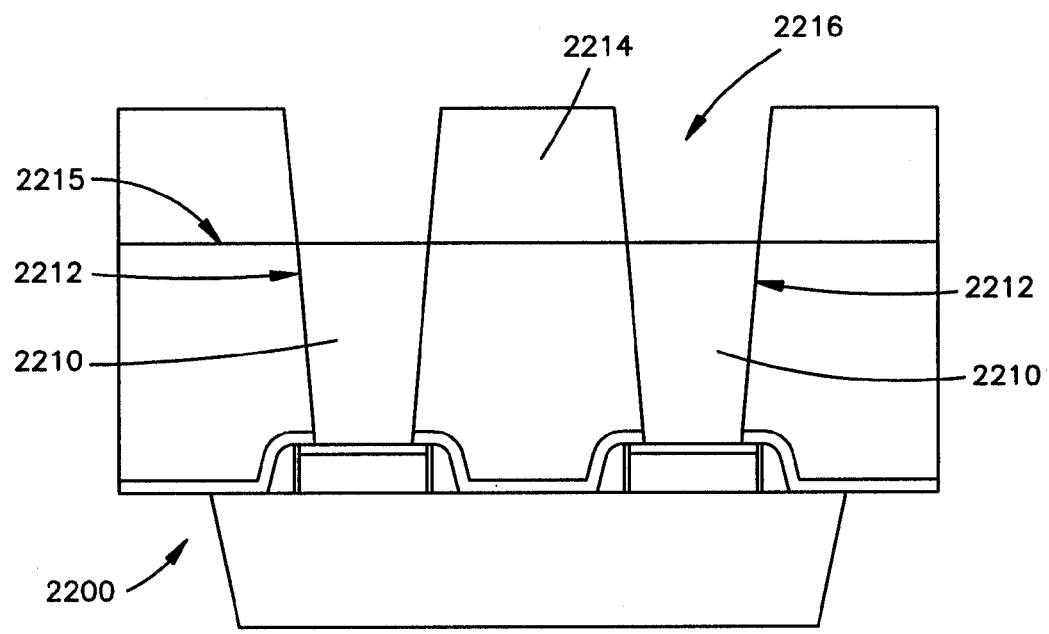
FIGS. 22a through 22d illustrate another transistor structure according to the present invention.

FIGS. 22a through 22d illustrate another transistor structure according to the present invention. FIG. 22a shows a conventional transistor structure 2200 manufactured up to the point of an M1 etch step, wherein contacts 2210 are formed within vias 2212. A dielectric substrate 2214 is formed on the upper surface 2215 of the structure 2200, and vias 2216 are formed above the contacts 2210.

Figure 22B:
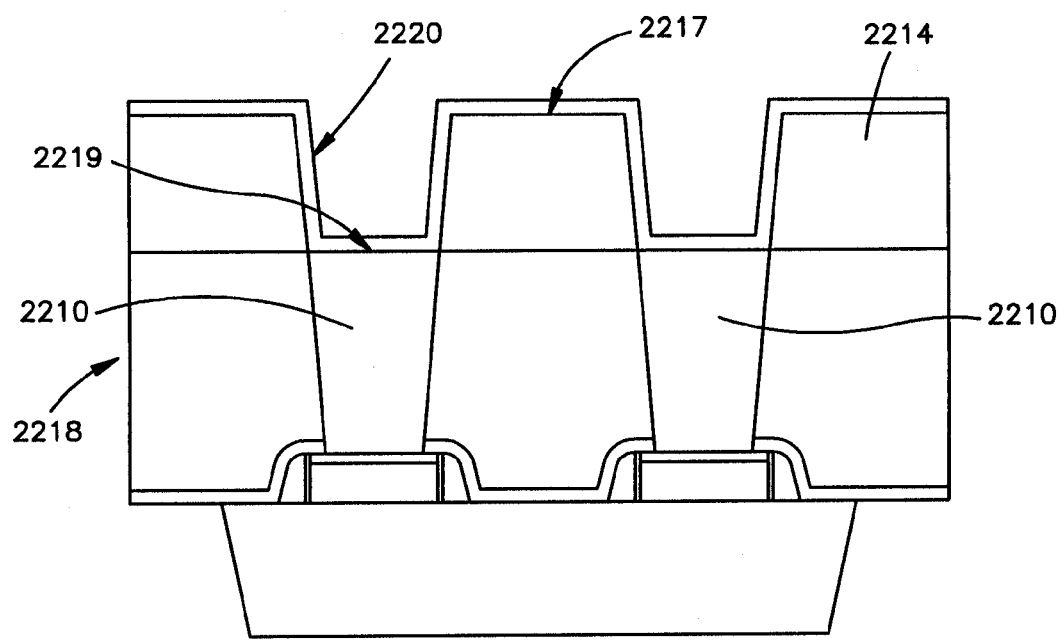
Figure 22C:
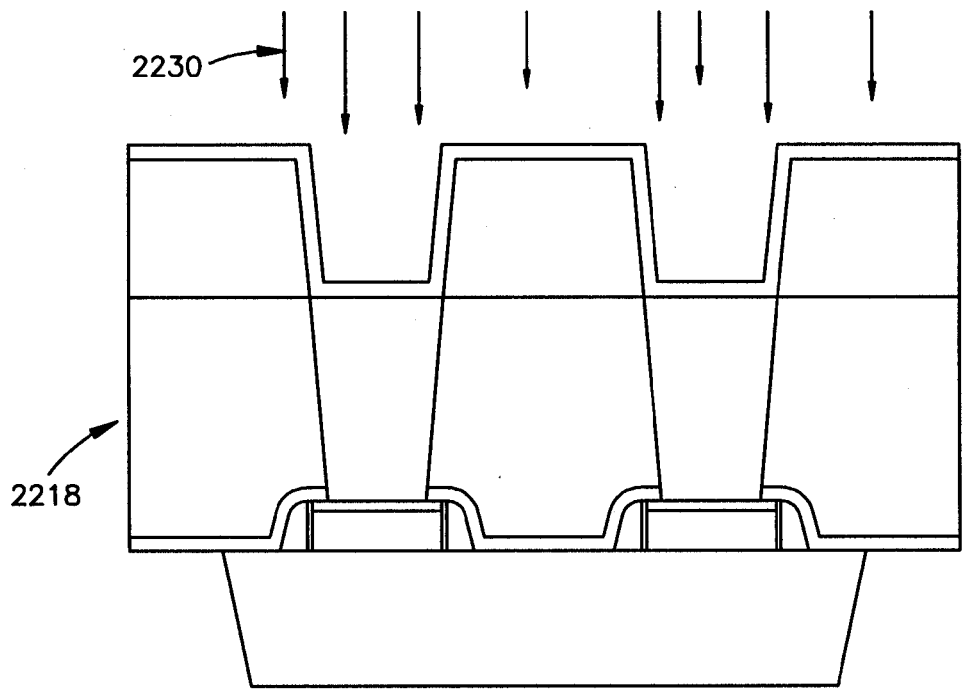
Figure 22D:
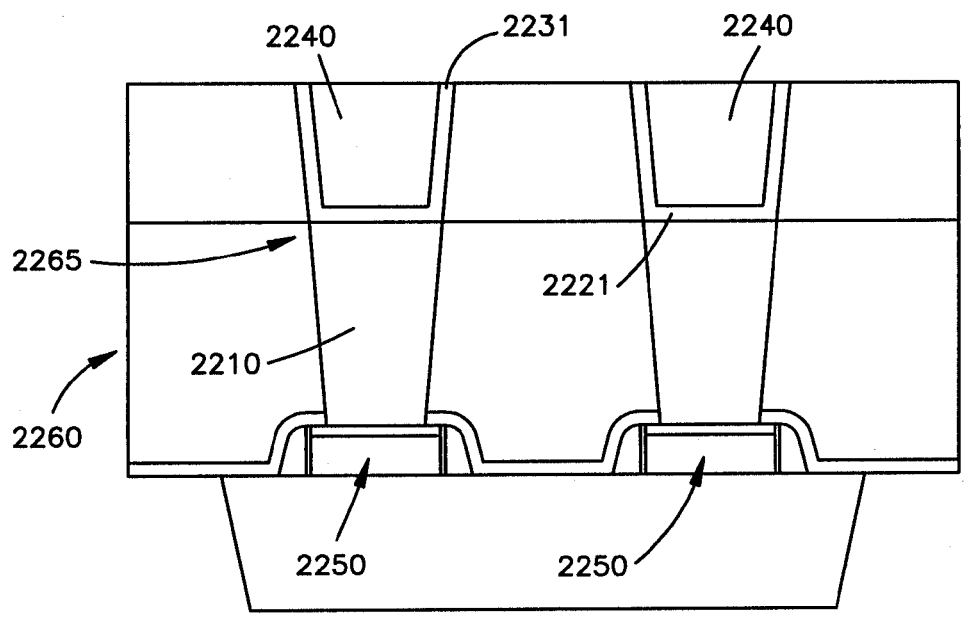

In FIG. 22b, a silicon layer 2220 is then sputter deposited onto the exposed dialectic substrate surfaces 2217 and the upper surfaces 2219 of the contacts 2210. FIG. 22c illustrates the step of treating 2230 the silicon layer 2220, such as with an Ozone process or an air exposure process. In order to minimize the oxide consumption when in contact with the metal barrier (TaN/Ta), it is preferred that a second silicon layer (not shown) is deposited onto the silicon layer 2220 and treated in a similar fashion. The structure 2200 is then processed for the remaining M1 etch through typical prior steps; liner seed, plating, and then CMP are completed. The resulting structure as illustrated in FIG. 22d provides high resistance contact structures formed by the contact 2240 and silicon resistor film layer 2221 on the nodes 2250 of the SRAM cell 2260 to protect against SER's according to the present invention.

Figure 23:
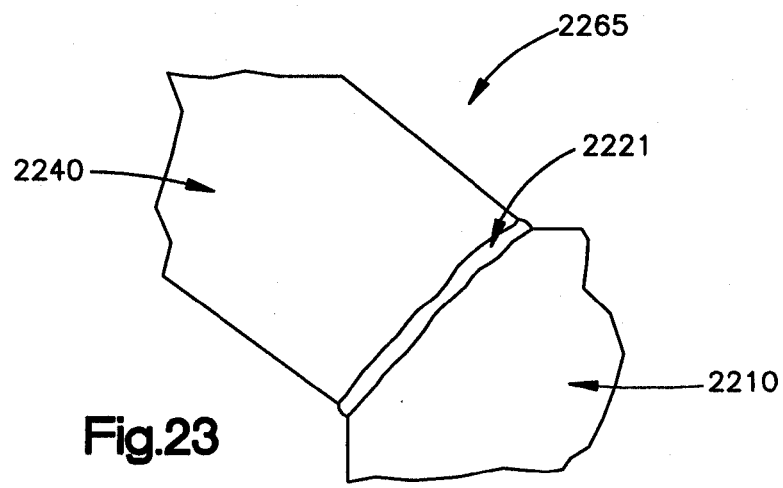
FIG. 23 is a detail illustration of an interface of an M1, silicon resistor film layer and contact of an SRAM according to the present invention.

FIG. 23 is a detail illustration of an interface 2265 of the M1 2240, silicon resistor film layer 2221 and contact 2210 of an SRAM 2260 according to the present invention.

Figure 24:
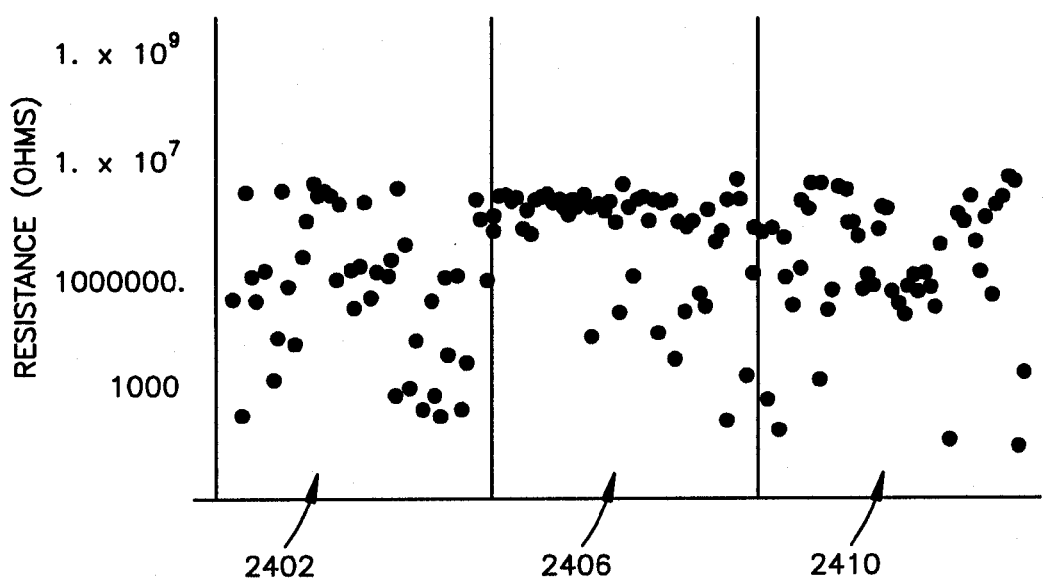
FIG. 24 is a graphical illustration of 4-point resistance measurements of three SRAM wafer embodiments of the present invention.
Figure 25:
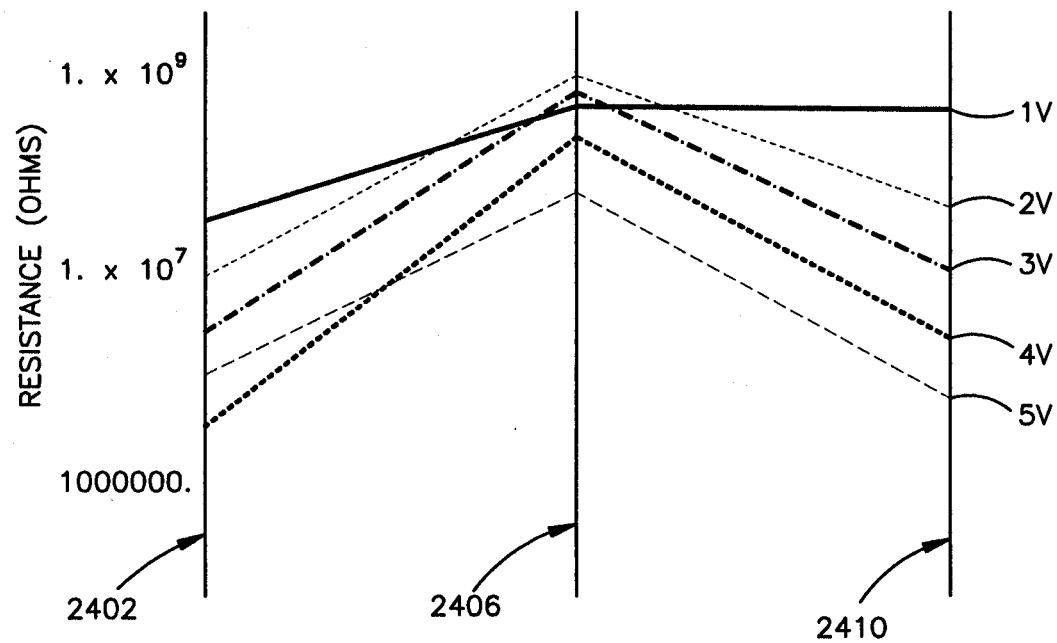
FIG. 25 is a graphical illustration of 2-point resistance measurements as a function of applied voltage of the three embodiments of FIG. 24.

FIGS. 24 and 25 provide graphical illustration of the behavior of three SRAM wafer embodiments of the present invention: "EXAMPLE 1"2402, "Example 2"2406 and "Example 3"2410. Example 1 is an SRAM wafer wherein a first resistive layer comprising 200 angstroms (A) Si is sputter disposed in a first chemical vapor deposition step upon an upper surface including a contact stud. The sputter tool apparatus then admits air for a "momentary air exposure break"for anywhere from about one minute to about ten minutes in a minimal oxidation second step, wherein the Si layer reacts with the air to form a silicon nitride compound layer. In a third step, the sputter tool then disposes another 200 A Si layer on top of the silicon nitride compound layer. Thus Example 1 provides an $Si/Si_xN_yO_z$ local resistor layer structure, where x, y and z are the atom numbers.

Example 2 and Example 3 are two other SRAM wafers wherein a first resistive layer comprising 200 A Si is sputter disposed in a first chemical vapor deposition step upon an upper surface including a contact stud. Ozone is then used in a minimal oxidation second step. Ozone is more reactive than air and is preferred over air to allow for improved control of oxidizing gas flow and the film thicknesses of the resultant oxidized layer. Accordingly, the time of oxidizing gas exposure is typically much shorter than the times required for air exposure as in the process for EXAMPLE 1, with Ozone gas exposure times preferably on the order of seconds or single digit minutes. The Si layer reacts with the Ozone to form a Silicon oxide compound layer. In one embodiment, the resultant $Si_xO_y$ layer has a thickness of about 180 A, where x and y are the atom numbers. In a third step, the sputter tool then disposes another 200 A Si layer on top of the silicon oxide compound layer. Thus, Example 2 and Example 3 provide an $Si/Si_xO_y$ local resistor layer structure.

FIG. 24 illustrates 4-point isolated CA resistance measurements at 1 uA, and FIG. 25 illustrates 2-point median isolated CA resistance as a function of voltage, for each of EXAMPLE 1 2402, Example 2 2406 and Example 3 2410.

Figure 26:
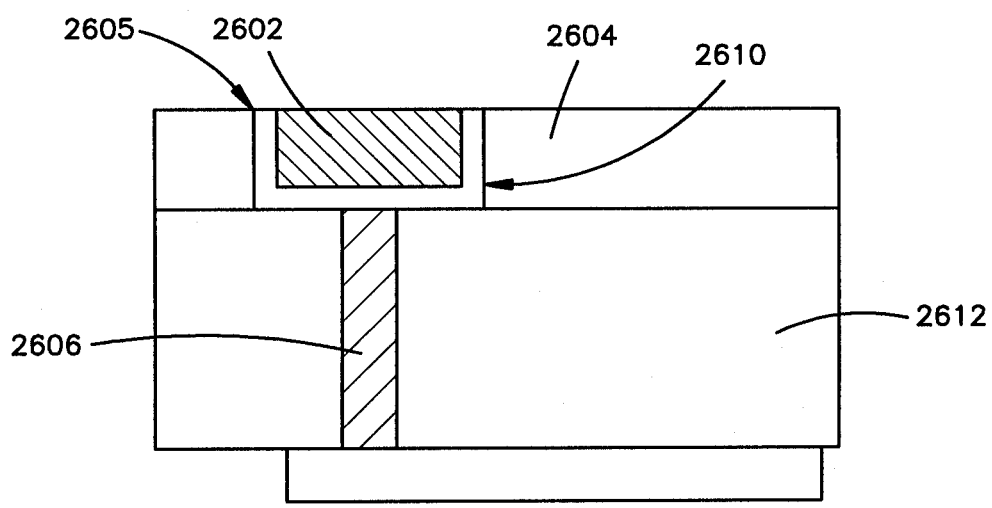
FIG. 26 is a sectional illustration of another SRAM wafer according to the present invention.
Figure 27:
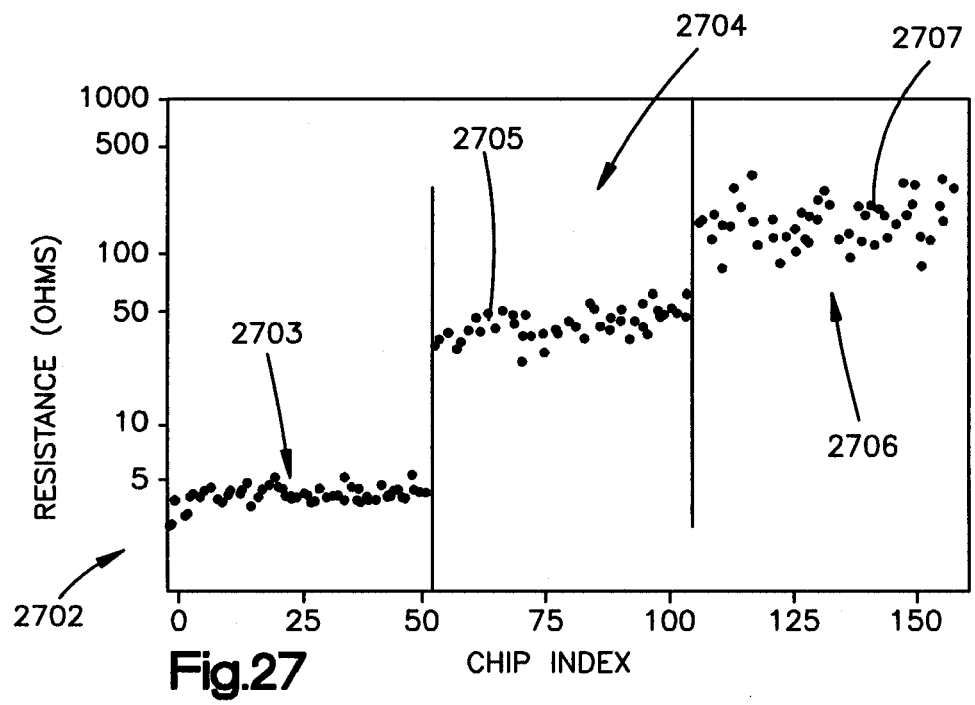
FIG. 27 is a graphical illustration of the resistance behavior of embodiments of the present invention.

FIG. 26 is a sectional illustration of another SRAM wafer according to the present invention. A copper M1 layer 2602 forms a circuit with a contact 2606 through a local resistor Si film layer 2610, wherein the copper layer 2602 and local resistor 2610 are formed within a void 2605 within a silk material 2604. The contact 2606 is formed within a bpsg material 2612. FIG. 27 plots the resistance behavior of two embodiments of the resistor layer 2610 as on three different examples wherein 50 chips per wafer are tested. For a typical prior art process-of-record (POR) structure 2702, with a prior art M1-to-contact structure without a resistive layer, the resistance values 2703 are all less than about 5 Ohms. For an M1-to-contact structure 2704 incorporating a 35 A thick Si layer 2610 according to the present invention, the resistance values 2705 reflect around 50 or less Ohms, thus providing a medium resistance local resistor structure preferable in some of the embodiments of the invention described above. And for an M1-to-contact structure 2706 incorporating a 50 A thick Si layer 2610, the resistance values 2707 reflect between about 100 to about 500 Ohms, thus providing a higher range of medium resistance local resistor structures preferable in some of the embodiments of the invention described above.

Figure 28:
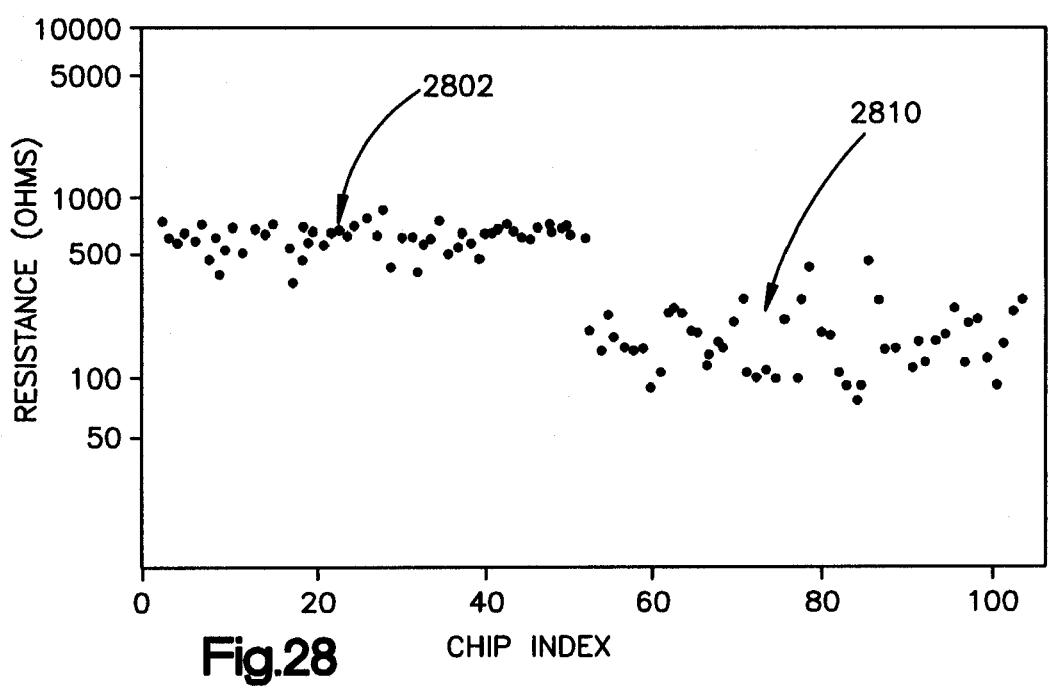
FIG. 28 is a graphical illustration of the resistance behavior of Si local resistor films according to the present invention.

FIG. 28 illustrates the resistance values returned by first and second embodiments 2802 and 2810, respectively, of Si local resistor films according to the present invention, wherein embodiment 2810 is produced through the process utilized to produce embodiment 2802, with the additional step of incorporating a Boron dopant. As reflected in the graph, the Boron doping process step reduces resistance values; however, the resultant local resistor structure values range greatly. Thus, embodiment 2810 may be preferable where some but not all of the contact studs require lower resistance, and especially where lateral ballasting issues prefer a non-uniform resistance distribution among the contact studs incorporating the local resistor film. While the invention has been described in terms of a single preferred embodiment, various alternatives and modifications can be devised by those skilled in the art without departing from the invention. Accordingly, the present invention is intended to embrace all such alternatives which fall within the scope of the appended claims.

The invention claimed is:

1. A method of forming a bipolar transistor contact stud with an integral resistor, said method comprising the steps of:
   a. providing a substrate having at least one contact area;
   b. forming an insulating layer over said substrate, said insulating layer overlying and in contact with the contact area;
   c. forming a contact hole in said insulating layer to expose the contact area;
   d. providing a first conductive material into the contact hole to form a contact stud having an upper surface and a lower surface, the lower surface in circuit connection with the contact area; and
   e. forming the integral resistor by disposing a resistive material layer within the contact hole on at least one of the contact stud upper surface and the contact stud lower surface;
   wherein said integral resistor is in a circuit series connection with said contact stud between the contact area and an electrical node of said bipolar transistor, the integral resistor has a resistance value of between about one Ohm and about ten Ohms, and the integral resistor is in circuit series connection with said contact stud with a base, emitter or collector of the bipolar transistor.

2. The method of claim 1, wherein the bipolar transistor is a silicon-on-insulator lateral diode, and the integral resistor and contact stud form a local resistor element in at least one of an anode, a cathode or a gate.

3. The method of claim 1, further comprising the step of placing a gate structure in parallel circuit connections to the local resistor element.

4. The method of claim 1, wherein the resistive material layer is a thin film chosen from the group consisting of a sputtered silicon material, a tunnel oxide, a tunnel nitride, a silicon-implanted oxide, a silicon-implanted nitride, and an amorphous polysilicon.

5. A method of forming an integral resistor and contact stud within a contact hole within a MOSFET semiconductor transistor drain structure, said method comprising the steps of:

a. providing a substrate having at least one contact area;
b. forming an insulating laser over said substrate, said insulating layer overlying and in contact with the contact area;
c. forming a contact hole in said insulating layer to expose the contact area;
d. providing a first conductive material into the contact hole to form a contact stud having an upper surface and a lower surface, the lower surface in circuit connection, with the contact area;
e. forming an integral resistor by disposing a resistive material layer within the contact hole on at least one of the contact stud upper surface and the contact stud lower surface, integral resistor and the contact stud thereby forming a first local resistor;
f. placing the integral resistor and contact stud in a circuit series connection with a gate, the resistor having a resistance value of between about one Ohm and about ten Ohms, wherein the drain has a composite resistance not equal to a source composite resistance and said integral resistor is in a circuit series connection with said contact stud between the contact area and an electrical node of said semiconductor;
g. forming a second integral resistor and second contact stud within a contact hole within the gate, the second integral resistor having a resistance greater than about 10 Ohms; and
h. placing the second integral resistor and the second contact stud in a circuit series connection with the first local resistor.

6. The method of claim 5, comprising the step of coupling the gate to ground through the second integral resistor.

7. The method of claim 5, wherein the resistive material layer is a thin film chosen from the group consisting of a sputtered silicon material, a tunnel oxide, a tunnel nitride, a silicon-implanted oxide, a silicon-implanted nitride, and an amorphous polysilicon.

8. A method of forming an integral resistor and contact stud within a contact hole within a MOSFET semiconductor transistor drain structure, said method comprising the steps of:
a. providing a substrate having at least one contact area;
b. forming an insulating layer over said substrate, said insulating layer overlying and in contact with the contact area;
c. forming a contact hole in said insulating layer to expose the contact area;
d. providing a first conductive material into the contact hole to form a contact stud having an upper surface and a lower surface, the lower surface in circuit connection with the contact area;
e. forming an integral resistor by disposing a resistive material layer within the contact hole on at least one of the contact stud upper surface and the contact stud lower surface;
f. placing the integral resistor and contact stud in a circuit series connection with a gate, the resistor having a resistance value of between about one Ohm and about ten Ohms, wherein the drain has a composite resistance not equal to a source composite resistance and said integral resistor is in a circuit series connection with said contact stud between the contact area and an electrical node of said semiconductor; and
g. modulating current flow through the MOSFET by selective placement of a plurality of integral resistor and contact stud structures throughout the drain.

9. The method of claim 8 wherein the step of modulating current flow comprises the step of forming a plurality of contacts on a drain side of the MOSFET:
wherein the step of forming the integral resistor and contact stud comprises forming an integral resistor and a contact stud structure within each of a group of the plurality of contacts in an interdigitated pattern, the pattern comprising an alternating distribution of contacts and integral resistor and contact stud structures.

10. A method of forming a SiGe transistor contact stud with an integral resistor, said method comprising the steps of:
a. providing a substrate having at least one contact area;
b. forming an insulating layer over said substrate, said insulating layer overlying and in contact with the contact area;
c. forming a contact hole in a base region or above an emitter in said insulating layer to expose the contact area;
d. providing a first conductive material into the contact hole to form a contact stud having an upper surface and a lower surface, the lower surface in circuit connection with the contact area; and
e. forming the integral resistor by disposing a resistive material layer within the contact hole on at least one of the contact stud upper surface and the contact stint lower surface;
wherein said integral resistor is in a circuit series connection with said contact stud between the contact area and an electrical node of said SiGe transistor, and
modulating current flow through the transistor by selective placement of a plurality of the integral resistor and contact stud structures throughout the base region or above the emitter, thereby changing the effective base resistance when the plurality of integral resistor and contact stud structures are located in the base region.

11. The method of claim 10 wherein the integral resistor has a resistance value of from about one to about ten Ohms.

12. The method of claim 10 wherein the step of modulating current flow comprises the step of forming a plurality of contacts in the base region;
wherein the step of forming the integral resistor and contact stud comprises forming an integral resistor and a contact stud structure within each of a group of the plurality of contacts in an interdigitated pattern, the pattern comprising an alternating distribution of contacts and integral resistor and contact stud structures.

13. The method of claim 10 wherein the step of modulating current flow comprises the step of selectively placing a plurality of integral resistor and contact stud structures above the emitter.

14. The method of claim 13 wherein the step of modulating current flow comprises the step of forming a plurality of contacts above the emitter;
wherein the step of forming the integral resistor and contact stud comprises forming an integral resistor and a contact stud structure within each of a group of the plurality of contacts in an interdigitated pattern, the pattern comprising an alternating distribution of contacts and integral resistor and contact stud structures.

15. The method of claim 10, wherein the resistive material layer is a thin film chosen from the group consisting of a sputtered silicon material, a tunnel oxide, a tunnel nitride, a silicon-implanted oxide, a silicon-implanted nitride, and an amorphous polysilicon.

16. The method of claim 15, wherein the resistive material layer is about 35 Angstroms thick and has a resistance value of no more than round 50 Ohms.

17. The method of claim 15, wherein the resistive material layer is about 50 Angstroms thick and has a resistance value of between about 100 Ohms to about 500 Ohms.

18. The method of claim 15, wherein the resistive material layer is about 200 Angstroms thick.

19. A bipolar transistor having a contact stud with an integral resistor, comprising:
 a. a substrate having at least one contact area;
 b. an insulating layer formed over said substrate, said insulating layer overlying and in contact with the contact area;
 c. a contact hole formed in said insulating layer to expose the contact area;
 d. a contact stud disposed in the contact hole, said contact stud having an upper surface and a lower surface, the lower surface in circuit connection with the contact area; and
 e. an integral resistive material layer disposed within the contact hole on at least one of the contact stud upper surface and the contact stud lower surface, wherein said resistive layer and said contact stud form a local resistor structure;
  wherein said local resistor structure is in a circuit series connection between the contact area and an electrical node of said bipolar transistor, the integral resistor has a resistance value of between about one Ohm and about ten Ohms, and the integral resistor is in circuit series connection with said contact stud with a base, emitter or collector of the bipolar transistor.

20. The semiconductor device of claim 19, wherein the bipolar transistor is a silicon-on-insulator lateral diode, and the integral resistor and contact stud form a local resistor element in at least one of an anode, a cathode or a gate.

21. The semiconductor device of claim 19, wherein a gate structure is in parallel circuit connection to the local resistor element.

22. The device of claim 19, wherein the resistive material layer is a thin film chosen from the group consisting of a sputtered silicon material, a tunnel oxide, a tunnel nitride, a silicon-implanted oxide, a silicon-implanted nitride, and an amorphous polysilicon.

23. A MOSFET semiconductor device having a contact stud with an integral resistor, comprising:
 a. a substrate having at least one contact area;
 b. an insulating layer formed over said substrate, said insulating layer overlying and in contact with the contact area;
 c. a contact hole formed in said insulating layer to expose the contact area;
 d. a contact stud disposed in die contact hole, said contact stud having an upper surface and a lower surface, the lower surface in circuit connection with the contact area;
 e. an integral resistive material layer disposed within the contact hole on at least one of the contact stud upper surface and the contact stud lower surface, wherein said resistive layer and said contact stud form a first local resistor struture, wherein said local resistor structure is in a circuit series connection between the contact area and an electrical node of said semiconductor device, wherein the local resistor structure and contact hole are formed within a transistor drain structure the local resistor structure in a circuit series connection, with a gate, the resistor having a resistance value of between about one Ohm and about ten Ohms, and wherein the drain has a composite resistance not equal to a source resistance;
 f. a second integral resistor disposed on a second stud within a contact hole within the gate, the second integral resistor having a resistance greater than about 10 Ohms; and
 g. the second integral resistor and second contact stud further in a circuit series connection with the first local resistor.

24. The semiconductor device of claim 23, wherein the gate is coupled to ground through the second integral resistor.

25. The device of claim 23, wherein the resistive material layer is a thin film chosen from the group consisting of a sputtered silicon material, a tunnel oxide, a tunnel nitride, a silicon-implanted oxide, a silicon-implanted nitride, and an amorphous polysilicon.

26. A MOSFET semiconductor device having a contact stud with an integral resistor comprising:
 a. a substrate having at least one contact area;
 b. an insulating layer formed over said substrate, said insulating layer overlying and in contact with the contact area;
 c. a contact hole formed in said insulating layer to expose the contact are;
 d. a contact stud disposed in the contact hole, said contact stud having an upper surface and a lower surface, the lower surface in circuit connection with the contact area;
 e. an integral resistive material layer disposed within the contact hole on at least one of the contact stud upper surface and the contact stud lower surface, wherein said resistive layer and said contact stud form a first local resistor structure, wherein said local resistor structure is in a circuit series connection between the contact area and an electrical node of said semiconductor device, wherein the local resistor structure and contact hole are formed within a transistor drain structure, the local resistor structure in a circuit series connection with a gate, the resistor having a resistance value of between about one Ohm and about ten Ohms, and wherein the drain has a composite resistance not equal to a source resistance; and
 f. a plurality of integral resistor and contact stud structures, in which a placement of the plurality of integral resistor and contact stud structures relative to other contact structures placed within the drain modulates current flow through the MOSFET.

27. The semiconductor device of claim 26, wherein a plurality of local resistor structures are located within the drain in an interdigitated pattern relative to the other contact structures, the pattern comprising an alternating distribution of other contacts and local resistor structures.

28. A SiGe transistor having a contact stud with an integral resistor, comprising:
 a. a substrate having at least one contact area;
 b. an insulating layer formed over said substrate, said insulating layer overlying and in contact with the contact area;
 c. a contact hole formed in said insulating layer to expose the contact area, the contact hole in a base region or above an emitter:
 d. a contact stud disposed in the contact hole, said contact stud having an upper surface and a lower surface, the lower surface in circuit connection with the contact area; and e. an integral resistive material layer disposed within the contact hole on at least one of the contact stud upper surface and the contact stud lower surface, wherein said resistive layer and said contact stud form a local resistor structure;

wherein said local resistor structure is in a circuit series connection between the contact area and an electrical node of said SiGe transistor, wherein the placement of a plurality of integral resistor and contact stud structures relative to other contact structures placed within the base region or above the emitter modulates current flow through the transistor, wherein if the local resistor structure contact hole is in the base region then thereby changing an effective base resistance.

29. The semiconductor device of claim 28, wherein the integral resistor has a resistance value of from about one to about ten Ohms.

30. The semiconductor device of claim 29, wherein the local resistor structure contact hole is in the base region, further comprising a plurality of local resistor structures located within the base region in an interdigitated pattern relative to the other contact structures, the pattern comprising an alternating distribution of other contacts and local resistor structures.

31. The semiconductor device of claim 28, wherein current flow through the transistor is modulated by selective placement of a plurality of local resistor structures above the emitter.

32. The semiconductor device of claim 31 further comprising a plurality of contacts above the emitter, wherein a plurality of local resistor structures are formed, each within each of a group of the plurality of contacts in an interdigitated pattern, the pattern comprising an alternating distribution of contacts and local resistor structures.

33. The device of claim 28, wherein the resistive material layer is a thin film chosen from the group consisting of a sputtered silicon material, a tunnel oxide, a tunnel nitride, a silicon-implanted oxide, a silicon-implanted nitride, and an amorphous polysilicon.

34. The device of claim 33, wherein the resistive material layer is about 35 Angstroms thick and has a resistance value of no more than around 50 Ohms.

35. The device of claim 33, wherein the resistive material layer is about 50 Angstroms thick and has a resistance value of between about 100 Ohms to about 500 Ohms.

36. The device of claim 33, wherein the resistive material layer is about 200 Angstroms thick.

37. A method of forming a static random access memory device contact stud with an integral resistor, said method comprising the steps of:

a. providing a substrate having at least one contact area;
b. forming an insulating layer over said substrate, said insulating layer overlying and in contact with the contact area;
c. forming a contact hole in said insulating layer to expose the contact area;
d. providing a first conductive material into the contact hole to form a contact stud having an upper surface and a lower surface, the lower surface in circuit connection with the contact area; and
e. forming the integral resistor by disposing a thin resistive film layer within the contact hole on at least one of the contact stud upper surface and the contact stud lower surface, wherein the tin resistive film layer is chosen from the group consisting of a sputtered silicon material, a tunnel oxide, a tunnel nitride, a silicon-implanted oxide, a silicon-implanted nitride, and an amorphous polysilicon;

wherein said integral resistor is in a circuit series connection with said contact stud between the contact area and an electrical node of said static random access memory device, the thin resistive film layer located in a cross coupling between art M1 metal cross coupling node and a polysilicon gate node at either a contact-to-M1 interface or a contact-to-polysilicon gate interface;

further comprising the step of limiting a width of the thin resistive film layer to a width of the contact hole.

38. The method of claim 37, wherein the thin resistive film layer is about 35 Angstroms thick and has a resistance value of no more than around 50 Ohms.

39. The method of claim 37, wherein the thin resistive film layer is about 50 Angstroms thick and has a resistance value of between about 100 Ohms to about 500 Ohms.

40. The method of claim 37, wherein the thin resistive film layer is about 200 Angstroms thick.

41. A static random access memory device having a contact stud with an integral resistor, comprising:

a. a substrate having at least one contact area;
b. an insulating layer formed over said substrate, said insulating layer overlying and in contact with the contact area;
c. a contact hole formed in said insulating layer to expose the contact area;
d. a contact stud disposed in the contact hole, said contact stud having an upper surface and a lower surface, the lower surface in circuit connection wit the contact area; and
e. a thin integral resistive film layer disposed within the contact hole on at least one of the contact stud upper surface and the contact stud lower surface, wherein said thin resistive film layer and said contact stud form a local resistor structure; wherein said local resistor structure is in a circuit series connection between the contact area and an electrical node of said static random access memory device, and the thin resistive film layer is located in a cross coupling between an M1 metal cross coupling node and a polysilicon gate node at either a contact-to-M1 interface or a contact-to-polysilicon gate interface;

wherein the thin resistive film layer further has a width no greater than the width of the contact hole; and wherein the thin resistive film layer is chosen from the group consisting of a sputtered silicon material, a tunnel oxide, a tunnel nitride, a silicon-implanted oxide, a silicon-implanted nitride, and an amorphous polysilicon.

42. The device of claim 41, wherein the thin resistive film layer is about 35 Angstroms thick and has a resistance value of no more than around 50 Ohms.

43. The device of claim 41, wherein the thin resistive film layer is about 50 Angstroms thick and has a resistance value of between about 100 Ohms to about 500 Ohms.

44. The device of claim 41, wherein the thin resistive film layer is about 200 Angstroms thick.

* * * * *